(12) United States Patent
Lu

(10) Patent No.: US 6,812,052 B2
(45) Date of Patent: Nov. 2, 2004

(54) METHOD FOR FABRICATING LOW-TEMPERATURE POLYSILICON ORGANIC ELECTROLUMINESCENT DEVICE

(75) Inventor: Tien-Rong Lu, Tainan (TW)

(73) Assignee: RITdisplay Corporation, Hsin Chu Industrial Park (TW)

(*) Notice: Subject to any disclaimer, the term of this patent is extended or adjusted under 35 U.S.C. 154(b) by 0 days.

(21) Appl. No.: 10/427,957

(22) Filed: May 2, 2003

(65) Prior Publication Data

US 2003/0207482 A1 Nov. 6, 2003

(30) Foreign Application Priority Data

May 3, 2002 (TW) ........................................ 91109296 A

(51) Int. Cl.$^7$ .............................................. H01L 21/00
(52) U.S. Cl. ............................ 438/29; 438/45; 438/82; 438/99; 313/504
(58) Field of Search ............................. 438/22, 29, 30, 438/45, 69, 99, 149, 166, 308, 82; 313/504–506

(56) References Cited

U.S. PATENT DOCUMENTS

| | | | | |
|---|---|---|---|---|
| 5,796,509 A | * | 8/1998 | Doany et al. | 359/254 |
| 5,834,894 A | * | 11/1998 | Shirasaki et al. | 313/509 |
| 6,246,460 B1 | * | 6/2001 | Young | 349/151 |
| 6,456,003 B1 | * | 9/2002 | Mori et al. | 313/504 |
| 6,469,318 B2 | * | 10/2002 | Yamada et al. | 257/59 |
| 6,559,604 B2 | * | 5/2003 | Lu et al. | 315/169.3 |
| 6,608,620 B1 | * | 8/2003 | Suzuki et al. | 345/204 |
| 6,614,174 B1 | * | 9/2003 | Urabe et al. | 313/504 |
| 2001/0011726 A1 | * | 8/2001 | Hayashi et al. | 257/59 |
| 2002/0036725 A1 | * | 3/2002 | Takasugi et al. | 349/43 |
| 2002/0137310 A1 | * | 9/2002 | Joo et al. | 438/487 |
| 2003/0127972 A1 | * | 7/2003 | Han et al. | 313/504 |

* cited by examiner

Primary Examiner—Amir Zarabian
Assistant Examiner—Khanh Duong
(74) Attorney, Agent, or Firm—Bacon & Thomas

(57) ABSTRACT

A method for fabricating a low temperature polysilicon organic electroluminescent substrate comprises the following steps: providing a substrate; forming an amorphous silicon layer on the substrate; forming a plurality of patterned transistor elements each having a patterned source, a patterned drain and a patterned gate on the amorphous silicon layer by photolithography and ion doping; annealing the patterned transistor element having the patterned source, drain and gate by excimer laser; forming a plurality of patterned stripe second conductive lines connected to the gates on the surface of the substrate; forming a patterned isolation layer on the gate layer, and also forming a plurality of patterned stripe first conductive lines and a patterned first electrode on the substrate; forming at least one organic electroluminescent medium on the first electrode; and forming a second electrode layer on the organic electroluminescent medium.

14 Claims, 2 Drawing Sheets

METHOD FOR FABRICATING LOW-TEMPERATURE POLYSILICON ORGANIC ELECTROLUMINESCENT DEVICE

BACKGROUND OF THE INVENTION

1. Field of the Invention

The present invention relates to a method for fabricating organic electroluminescent (OEL) display devices, and more particularly to a low temperature polysilicon (LPTS) OEL display device and method for fabricating the same.

2. Description of Related Art

It is well known that display device is an important interface between a machine and its user for transmitting information. In recent years, flat panel display (FPD) devices have gradually replaced the known cathode radiation tube (CRT) display and become the main products of the display devices. The flat panel display (FPD) devices are popular in the market because of their advantages such as lightweight, small size and compactness. In addition, the rapid development of the information technology also induces a demand for a display device with high-resolution and high-volume-communication of information. However, the typical flat panel display (FPD) devices such as amorphous silicon thin-film-transistor liquid crystal display ($\alpha$-Si TFT LCD) are unable to meet the need for an efficient display. Under this circumstance, the display-industry began to develop a LTPS TFT (low temperature poly silicon thin film transistor) technique with superior performance to meet the demand of market. On the other hand, OEL devices also attract people's attention for being a new generation of the FPD recently because of their advantages such as lightweight, high contrast, fast response time, low power consumption and high brightness. However, the technique of mass production of OEL has not yet become completely matured. Therefore, only-some samples made from the laboratory show up for demonstration. For commercialization and mass-production of the LTPS OEL devices, there are still a number of technical obstacles, which need to be solved.

Generally speaking, the conventional manufacturing method of LTPS TFTs includes thin film deposition, photo-lithography and etching techniques for fabricating the TFTs and pixel electrodes. Moreover, the LTPS TFTs require a special technique such as excimer laser annealing, to crystallize an $\alpha$-Si (amorphous silicon). After the excimer laser annealing process, doped atoms (dopants) are implanted into the LTPS TFTs at the appropriate sites such as a source, a drain, a lightly doped drain (LDD) and a channel thereof, as the conventional ion-implantation for processing polysilicon. Then, a high-temperature treatment by a furnace or rapid thermal annealing is proceeded to activate the dopants and crystallize the ion-damaged surface to rearrange to a polysilicon structure.

However, in the ion-implantation, some of the fast implanted ions will penetrate the polysilicon which has an ordered crystallographic orientation structure and be buried in another layer (e.g. substrate) next to the bottom of polysilicon. These penetrated implanted ions frequently result in device failure. So far, for achieving a good ion implantation by avoiding ions from penetrating through the exposed tunnels of the polysilicon and device failure caused by defects, the conventional ion-implantation is achieved by implanting ions in a tilted angle. This tilted angle technique include steps of controlling the angle of incidence of the ion beam with a tilt of five to ten degrees with respect to the normal and further reduces the possibility of exposing the tunnels. The penetration of implanted ions in the polysilicon layer can be also avoided by alternatively forming a film of different material over the polysilicon, such as oxide or $\alpha$-Si. The tunneling effect can be effectively reduced during ion implantation through scattering effect caused by the film of different material over the polysilicon. However, the above-mentioned processing of the methods are complicated and the efficiency of the process for mass-manufacturing LTPS OEL is greatly reduced.

Furthermore, the most appropriate process for mass production is a process with less thermal budget and less processing time. However, in the conventional production of the LTPS-TFT panel, a complementary metal oxide semiconductor (CMOS) process generally requires six to ten ion-implantation processing steps for different sites of a transistor element. A time-consuming and high-thermal-budget annealing for activating the dopants is also required after every ion-implantation for each site. Namely, for the conventional CMOS process, six to ten annealing steps for activating dopants are also required. This is a considerable time-consuming obstacle in the processes of mass production to be overcome as far as manufacturing efficiency and yield are concerned. Hence, it is a need to have a high efficient processing technique to meet the device needs and to increase the manufacturing yield.

SUMMARY OF THE INVENTION

It is therefore an object of the present invention to provide a method for fabricating LTPS OEL devices, which decreases the thermal budget for fabricating the LTPS OEL devices, reduces production cost, simplifies manufacturing processes and increases the efficiency of mass production of the OEL devices and yield.

It is a further object of the present invention to provide a method for fabricating LTPS OEL devices, which not only transforms $\alpha$-Si into polysilicon but also activates dopants by excimer laser annealing at the same time, wherein the dopants implanted into the $\alpha$-Si film in advance by ion-implantation serve as seeds so as to reduce the activation energy of crystallization and increase the efficiency of crystallization.

It is still a further object of the present invention to provide a method for fabricating LTPS OEL devices, which not only transforms $\alpha$-Si into polysilicon but also activates dopants by excimer laser annealing to prevent tunneling effect during the ion-implantation process at the same time after ions are implanted at every site of the grown $\alpha$-Si layer, wherein the dopants implanted into the $\alpha$-Si film in advance by ion-implantation serve as seeds so as to reduce the activation energy of crystallization and increase the efficiency of crystallization.

A method for fabricating a LTPS OEL substrate according to the present invention comprises the following steps: providing a substrate; forming an amorphous silicon layer on said substrate; forming a plurality of patterned transistor element each having a patterned source, a patterned drain and a patterned gate on said amorphous silicon layer through photolithography and ion doping; annealing said transistor elements having said patterned sources, drains and gates by direct radiation of excimer laser; forming a plurality of patterned stripes of second conductive lines connected to said gates on the surface of said substrate; forming a patterned isolation layer on said gate layer and part of said second conductive lines, and also forming a plurality of patterned stripes of first conductive lines and a patterned first electrode on said substrate wherein said first and said second conductive lines sandwich said isolation layer, said first conductive lines are connected to said sources and said first electrode is connected to said drains; forming at least one organic electroluminescent medium on said first electrode; and forming a second electrode layer on said organic electroluminescent medium; wherein said first conductive lines and said second conductive lines are intersected without directly electrical contact.

To illustrate the present invention, exemplary embodiments of a method for fabricating LTPS OEL devices will now be described with reference to the accompanying drawings.

DETAILED DESCRIPTION OF THE PREFERRED EMBODIMENT

Figure 1:
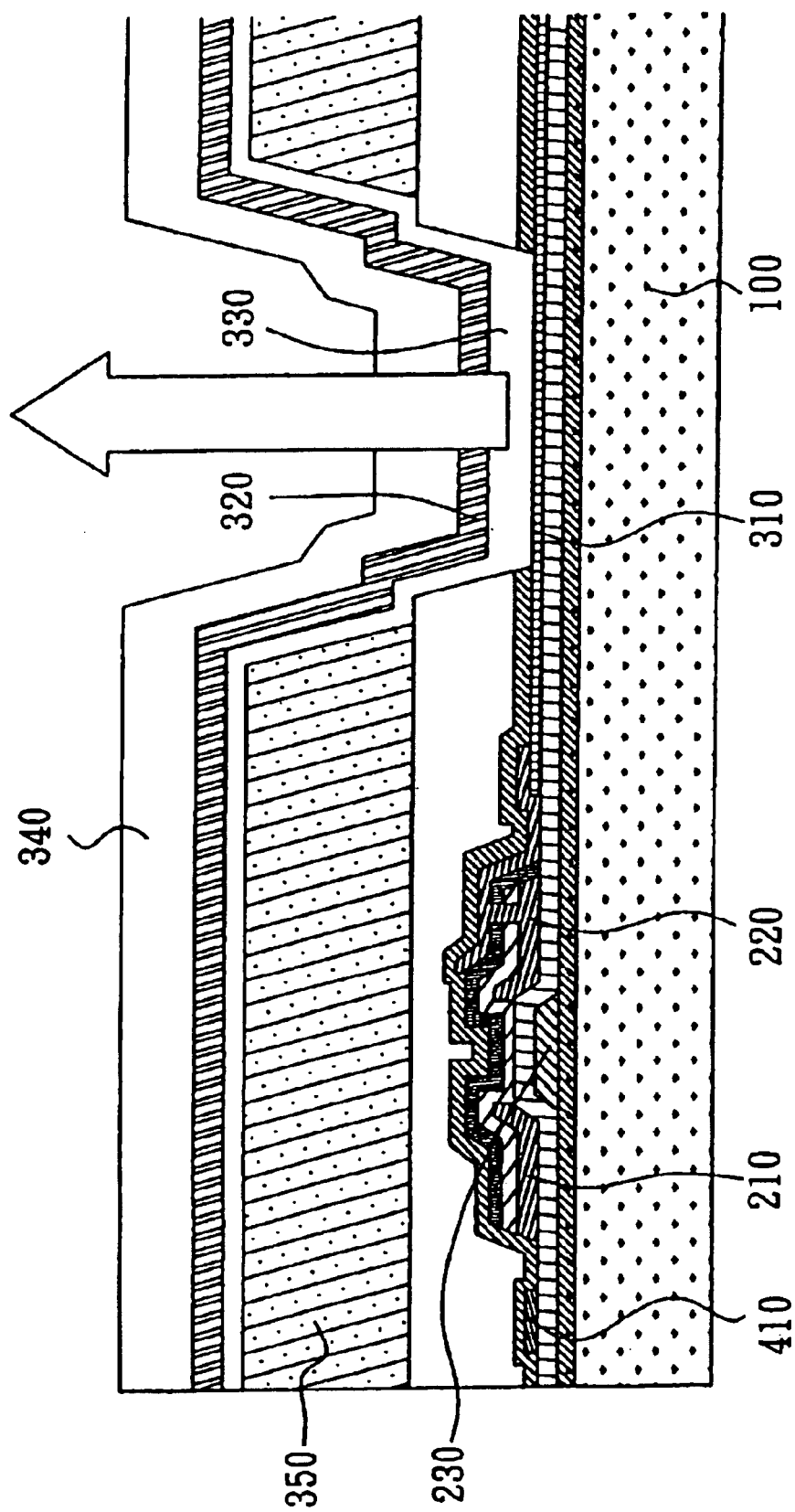
FIG. 1 is a cross-sectional view of the function elements and the pixels of the LTPS OEL panel according to the present invention.

The processing sequence of forming the layer of the first conductive lines and layer of the second conductive lines on the substrate according to the method for fabricating the LTPS OEL panel of the present invention is not limited. Preferably, the second conductive line layer is formed on the substrate prior to forming the first conductive line layer. The first electrode or auxiliary electrode of the TFT-OEL panel according to the present invention can be made of any conventional conductive material. Preferably, the first electrode or auxiliary electrode of the TFT-OEL panel of the present invention is made of a low-resistance metal. Most preferably, the first electrode or auxiliary electrode of the TFT-OEL panel of the present invention is made of chromium, molybdenum, tungsten, aluminum, silver, an aluminum-magnesium alloy, a silver-copper alloy or a silver-magnesium alloy. The second electrode (anode) of the LTPS OEL panel of the present invention can be made of any conventional conductive material. Preferably, the second electrode (anode) of the LTPS OEL panel according to the present invention is made of a transparent electrode material. Most preferably, the second electrode (anode) of the LTPS OEL panel according to the present invention is made of indium tin oxide (ITO) or aluminum zinc oxide (AZO). It is preferable that the sources and drains of the TFT-OEL panel according to the present invention should be made of the same material, and more preferably, LTPS. The TFT-OEL panel has a typical organic electroluminescent medium. Preferably, the organic electroluminescent medium further includes an electron transport layer, an electron injection layer, a light-emission layer, a hole transport layer or a hole injection layer wherein the electron transport layer, the electron injection layer, the light-emission layer, the hole transport layer or the hole injection layer is interposed between the first electrode and the second electrode. Moreover, at least one passivation layer can be selectively formed between the first conductive lines and the second conductive lines of the TFT-OEL panel according to the present invention. The passivation layer can be a typical passivation layer. Preferably, the passivation layer is a polyimide layer, an acrylic resin layer, a fluororesin layer, an epoxy layer or a silicon oxide layer. The relative positions of the gates, the sources and the drains of the TFT-OEL panel according to the present invention can be any conventional arrangement (e.g. bottom-gate arrangement or top gate arrangement). Preferably, the gates are interposed between the sources (or the drains) and the substrate (that is, bottom-gate arrangement). It is preferable that an isolation layer is formed between the sources and the gates of the LTPS OEL panel according to the present invention. In the method for fabricating the LTPS OEL substrate according to the present invention, the typical processing step of forming α-Si on the substrate can be used. Preferably, α-Si is formed on the substrate by vapor deposition. In the method for fabricating the LTPS OEL panel according to the present invention, the conventional processing steps are used to pattern the sources, the drains, the LDD layer and the channel. Preferably, photolithography, ion-doping and ion implantation are used for the formation of the sources, the drains, the LDD layer and the channel. Most preferably, an excimer laser is used for annealing and activating the sources, the drains, the LDD layer and the channel after photolithography, ion-doping and ion-implantation. It is preferable that the method for fabricating the TFT-OEL panel according to the present invention should further include processing steps of forming a patterned isolation layer on each transistor element having patterned gate first, and then forming patterned source and drain on each isolation layer.

It is preferable that the LTPS OEL display panel according to the present invention be formed as a display panel having an array of a plurality of red, green and blue light-emitting pixels to display an image, and also, the LTS OEL display panel according to the present invention may be formed as a monochromatic display panel having an array of light-emitting pixels, if so desired.

The LTPS OEL display panel fabricated according to the present invention can be applied to any environments or apparatus for displaying images, graphics, characters and text. Preferably, the LTPS OEL display panels of the present invention are used as display devices of televisions, computers, printers, monitors, vehicles, display interfaces of signal machines, communication apparatus, telephones, lamp equipments, headlights, interactive electronic books, microdisplays, fishing devices, personal digital assistants (PDA), game means, airplane equipments and head-mounted displays.

The present invention is described with reference to a preferred embodiment of the OEL devices and method for fabricating the same.

Figure 2:
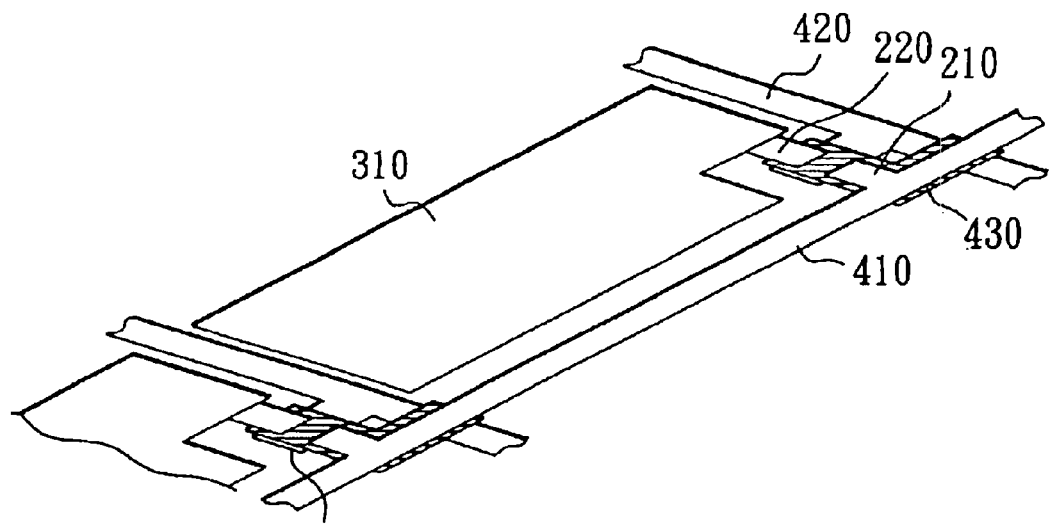
FIG. 2 is a schematic diagram of the LTPS OEL panel according to the present invention.
Figure 3:
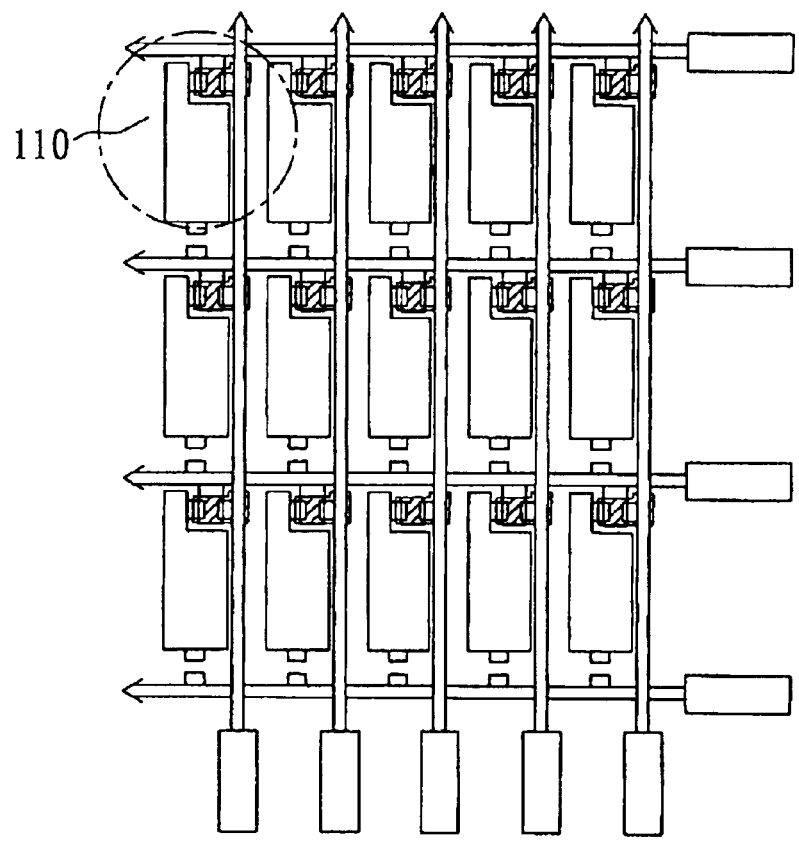
FIG. 3 is a schematic diagram of the pixel display units of the LTPS OEL panel according to the present invention.

Referring to FIGS. 1, 2 and 3, FIG. 1 is a schematic view of the present invention. The LTPS OEL panel for a display device is a substrate 100 having a plurality of pixels 110. Each of the pixels 110 has a transistor element 200 and a display electrode element. The transistor element 200 is a TFT switch unit having a source 210, a gate 230 and a drain 220. In this preferred embodiment, the transistor element 200 is fabricated by photolithography and doping of the CMOS process on a substrate. The patterned sources and drains of the transistor elements 200 are formed through the processes of the conventional LTPS treatment, excimer laser annealing and activation. As shown in FIG. 1, the display electrode element of the pixels is formed on the surface of the substrate 100. At least two electrode layers 310, 320 and an organic electroluminescent medium 330 are also formed on the substrate for emitting light. In the structure of these electrode layers, the layer over the substrate surface is a cathode 310. An anode 320 is formed above the cathode 310 by sandwiching an organic electroluminescent medium 330 in-between. The cathode 310 and the anode 320 sandwich the organic electroluminescent medium 330. In this preferred embodiment, the cathode is made of aluminum, silver, an aluminum-magnesium alloy, a silver-copper alloy or a silver-magnesium alloy. The anode is a transparent ITO electrode or AZO. The cathode 310 of the display electrode element of the pixels is connected to the drain 220 of the transistor element 200 of the pixels so as to provide an electric current sufficient to drive the organic electroluminescent medium layer 330 of the display electrode element for luminance when the electric current flows through the source 210 to the drain 220.

A plurality of stripes of conductive lines are formed between the pixel display units 110 on the panel. The conductive lines can be divided into two sets. The first set of the conductive lines is a source conductive line 410 consisting of conductive lines being arranged parallel to one another. In this preferred embodiment, the conductive lines are formed as stripes parallel to each other. Each of the first set of the conductive lines is connected to the source 210 of the transistor element 200 of the pixel display units 110 to transmit a display signal. In this preferred embodiment, the first set of the conductive lines and the cathode 310 of the display electrode element are made of the same material. Preferably, they are made of aluminum, an aluminum-magnesium alloy, a silver-copper alloy or a silver-magnesium alloy in this preferred embodiment.

The second set of the conductive lines is a gate conductive line 420 consisting of conductive lines being arranged parallel to one another. In this preferred embodiment, the conductive lines are formed as stripes parallel to each other. Each of the second set of the conductive lines is connected to the gate 230 of the transistor element 200 of the pixel display units 110 to transmit a signal.

According to the method for fabricating OEL devices of the present invention, an α-Si layer is formed on the substrate 100. In this preferred embodiment, the α-Si layer is formed on the surface of a glass substrate by CVD. Then, the transistor element 200 is formed on the α-Si substrate in accordance with the CMOS process of the present invention.

The TFT element 200 can be made either by forming gates first or by forming sources (or drains) first. The sequence for formation of gates or that of sources (or drains) depends on the type (e.g. top-gate or bottom-gate) of TFTs on the substrate. In the present embodiment, the TFT elements 200 are bottom-gate TFTs. The TFT element 200 is formed by the CMOS process of the present invention includes the step of forming patterned gates by sputtering (or evaporation) and photolithography. The photolithography at least includes photoresist-coating, exposure, development and etching. After the gates are formed, a layer of isolation material 430 is deposited, and the isolation layer is patterned by photolithography. Then, a LDD layer is patterned by photolithography, doping or ion implantation. The patterned sources and drains of the panel of the present invention are formed through sputtering (or evaporation) and photolithography. Then, the patterned source and drain are further annealed by excimer laser, and thus both patterned sources and drains are transformed from α-Si into polysilicon and the activation of dopants are achieved by radiation of excimer laser (e.g. from the bottom side of the gate) simultaneously. According to this process, the dopants implanted into the α-Si layer in advance can act as seeds to reduce the activation energy of crystallization and increase the efficiency of crystallization in the excimer laser annealing. Therefore, the thermal budget for fabricating the LTPS OEL TFT switches (or TFT elements) can be greatly reduced.

Then, gate conductive lines 420 (the second conductive lines) are formed by photolithography. Further, a layer of the source conductive lines 410 and a material of the cathodes 310 are deposited wherein the main composition of the material of the source conductive line 410 and the cathode 310 may or may not be identical. In this preferred embodiment, the source conductive line 410 and the cathode 310 are made of the same material such as aluminum or silver, and the source conductive line 410 and the cathode 310 are patterned by photolithography. The source conductive lines 410 (the first conductive lines) are connected to the polysilicon sources 210 or drains 220. The drains 220 are connected to the cathode. Therefore, transistor elements 200 having the patterned gates 230, sources 210 and drains 220 are formed on the substrate. Then, the cathode 310 of the pixel, the source conductive line 410, the gate conductive line 420 of the panel are also formed on the substrate.

Subsequently, an adhesive dielectric layer 350 is deposited on the substrate surface for covering the surface areas except the cathode 310. The adhesive dielectric layer 350 is formed and patterned by photolithography for protect the transistor elements 200. Then, at least an organic electro luminescent medium layer is formed on the surface of the cathode of the pixel. The organic electroluminescent medium layer can be made of small molecules or polymers. The organic electroluminescent medium layer can optionally includes a hole injection layer, a hole transport layer, an organic electroluminescent medium layer, an electron transport layer and an electron injection layer. The organic electroluminescent medium layer is formed by evaporation in this preferred embodiment. After forming the organic electroluminescent medium layer, an anode 320 is formed on the top surface of the organic electroluminescent medium layer. In this embodiment, the anode 320 is a transparent electrode of ITO. After all the cathodes and anodes are formed, a layer of passivation 340 is deposited for protecting the whole layers and all the elements on the substrate of the OEL display panel.

According to the method for fabricating the OEL devices of the present invention, a α-Si film is formed on the substrate during the formation of the TFT element. Then, the patterned sources and drains are formed by ion-implantation. The patterned α-Si sources and drains are transformed into patterned polysilicon sources and drains at one time by excimer laser annealing. Thus, the tunneling effect during ion-implantation is prevented by effectively using the disordered non-crystal structure of α-Si. In addition, the patterned α-Si sources and drains are transformed into patterned polysilicon sources and drains by the following processing steps in turn: (1) growing the α-Si layer, (2)completing ion implantation at every site of the α-Si layer, and (3) annealing the sources and drains or any other element that needs to be transformed by excimer laser. It is therefore not necessary to have an individual excimer laser annealing process for each element such as the source or the drain after ion-implantation. In this respect, the typical process for LTPS CMOS substrate appears complicated and inefficient.

Namely, according to the method for fabricating the OEL devices of the present invention, only one step of excimer laser annealing is required for transforming α-Si into polysilicon at the site of the patterned polysilicon sources and drains (for example, patterned by photolithography and ion implantation). At the time of annealing through the excimer laser, the activation of dopants can be achieved simultaneous through the radiation of the excimer laser after the α-Si sources and drains are patterned (for example, by photolithography and ion implantation). In contrast, in the typical process for fabricating the LTPS TFT panel, the ion-implantation process needs to be carried out at different sites of a device. Also, an annealing process for activating dopants in the time-consuming thermal budget process is required for each site after every ion-implantation. The typical CMOS process generally uses six to ten ion implantation steps, and accordingly, six to ten annealing processing steps for activating the dopants are required. In this invention, the indispensable thermal budget processes have been significantly reduced, and the yield and the manufacturing efficiency are significantly increased. Further, according to the present invention, the OEL devices and method for fabricating the same can not only transform α-Si into polysilicon but also activate dopants by excimer laser annealing to prevent tunneling effect during the ion-implantation process after ions are implanted at every site of the grown α-Si layer, wherein the dopants implanted into the α-Si film in advance by ion implantation serve as seeds for crystallization in the excimer laser annealing process so as to reduce the activation energy of crystallization and increase the efficiency of crystallization.

Further, according to the OEL devices and method for fabricating the same of the present invention, the formation of the cathode material and the bus line of the LTPS panel are combined into one processing step so as to refrain from the step of coating a cathode film on the OEL panel as involved in the typical LTPS TFT panel process. Thus, the present invention achieves the effect of reducing RC delay.

Although the present invention has been explained in relation to its preferred embodiments, it is to be understood that many other possible modifications and variations can be made without departing from the spirit and scope of the invention as hereinafter claimed.

What is claimed is:

1. A method for fabricating a low temperature polysilicon organic electroluminescent display panel, comprising the following steps:

providing a substrate;

forming an amorphous silicon layer on said substrate;

forming a plurality of patterned transistor element each having a patterned source, a patterned drain and a patterned gate on said amorphous silicon layer through photolithography and ion doping;

annealing said transistor elements having said patterned sources, said patterned drains and said patterned gates by direct radiation of excimer laser;

forming a plurality of patterned stripes of second conductive lines connected to said gates on the surface of said substrate;

forming a patterned isolation layer on said gate layer and part of said second conductive lines, and also forming a plurality of patterned stripes of first conductive lines and a patterned first electrode on said substrate wherein said first and said second conductive lines sandwich said isolation layer, said first conductive lines are connected to said sources and said first electrode is connected to said drains;

forming at least one organic electroluminescent medium on said first electrode; and forming a second electrode layer on said organic electroluminescent medium;

wherein said first conductive lines and said second conductive lines are intersected without direct electrical contact.

2. The method as claimed in claim 1, wherein said patterned transistor element having said patterned source, drain and gate, is formed by the following steps:

forming said patterned gate layer on said amorphous silicon layer first; forming said patterned isolation layer; and then forming said patterned source, and said patterned drain on each said isolation layer to thereby form said patterned transistor element having said patterned source, drain and gate.

3. The method as claimed in claim 1, wherein said amorphous silicon layer is formed by chemical vapor deposition or sputtering.

4. The method as claimed in claim 1, wherein said organic electroluminescent medium is formed by evaporation.

5. The method as claimed in claim 1, wherein the main composition of said first electrode is made of the material as that of said first conductive lines.

6. The method as claimed in claim 1, wherein said first electrode is made of chromium, molybdenum, tungsten, copper, silver, aluminum, a silver-magnesium alloy, a silver-copper alloy or an aluminum-magnesium alloy.

7. The method as claimed in claim 1, wherein the material of said first conductive lines or said second conductive lines are made of chromium, molybdenum, tungsten, copper, silver, aluminum, a silver-magnesium alloy, a silver-copper alloy or an aluminum-magnesium alloy.

8. The method as claimed in claim 1, wherein said second electrode is transparent.

9. The method as claimed in claim 1, wherein said second electrode is made of indium tin oxide.

10. The method as claimed in claim 1, wherein said second electrode is made of aluminum zinc oxide.

11. The method as claimed in claim 1, wherein at least one patterned adhesive dielectric layer is formed on part of said first electrode prior to forming at least one organic electroluminescent medium on said first electrode.

12. The method as claimed in claim 11, wherein said adhesive dielectric layer is a polyimide layer, an acrylic resin layer, a fluororesin layer, an epoxy layer or a silicon oxide layer.

13. The method as claimed in claim 1, further comprising a step of forming an electron transport layer, an electron injection layer, and a hole transport layer or a hole injection layer on said first electrodes prior to forming said second electrodes.

14. The method as claimed in claim 1, wherein said transistor element having said patterned source, drain and gate is doped by ion-implantation.

* * * * *